(12) United States Patent
Hsieh

(10) Patent No.: US 11,329,015 B2
(45) Date of Patent: May 10, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Meng-Wei Hsieh, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 64 days.

(21) Appl. No.: 16/789,236

(22) Filed: Feb. 12, 2020

(65) Prior Publication Data

US 2021/0249367 A1 Aug. 12, 2021

(51) Int. Cl.

| H01L 23/48 | (2006.01) |
|---|---|
| H01L 23/52 | (2006.01) |
| H01L 29/40 | (2006.01) |
| H01L 23/66 | (2006.01) |
| H01L 21/48 | (2006.01) |
| H01L 23/498 | (2006.01) |
| H01Q 1/22 | (2006.01) |

(52) U.S. Cl.
CPC ............ *H01L 23/66* (2013.01); *H01L 21/486* (2013.01); *H01L 23/49827* (2013.01); *H01L 2223/6677* (2013.01); *H01Q 1/2283* (2013.01)

(58) Field of Classification Search
USPC ...................................................... 257/774
See application file for complete search history.

(56) References Cited

U.S. PATENT DOCUMENTS 9,620,464 B2 4/2017 Baks et al.
2020/0073207 A1* 3/2020 Okahisa ................. G03B 15/02

* cited by examiner

*Primary Examiner* — Niki H Nguyen
(74) *Attorney, Agent, or Firm* — Foley & Lardner LLP

(57) ABSTRACT

A semiconductor device package includes an emitting device and a first building-up circuit. The emitting device defines a cavity in the emitting device. The first building-up circuit is disposed on the emitting device.

15 Claims, 20 Drawing Sheets

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including an antenna and a method of manufacturing the same.

2. Description of the Related Art

Wireless communication devices, such as cell phones, typically include antennas for transmitting and receiving radio frequency (RF) signals. Comparably, a wireless communication device includes an antenna and a communication module, each disposed on different parts of a circuit board. Under the comparable approach, the antenna and the communication module are separately manufactured and electrically connected to each other after being placed on the circuit board. Accordingly, separate manufacturing costs may be incurred for both components. Furthermore, it may be difficult to reduce a size of the wireless communication device to attain a suitably compact product design. To reduce the cost and package size, an Antenna-in-Package (AiP) approach is provided. In general, an organic substrate is commonly used in an AiP system. However, due to the process limitation of the organic substrate, it is difficult to achieve fine-pitch (less than 15/15 μm), and the thickness of the organic substrate is relatively thick, which will hinder the miniaturization of the AiP system.

SUMMARY

In accordance with some embodiments of the present disclosure, a semiconductor device package includes an emitting device and a first building-up circuit. The emitting device defines a cavity in the emitting device. The first building-up circuit is disposed on the emitting device.

In accordance with some embodiments of the present disclosure, a semiconductor device package includes an emitting device and an encapsulant. The emitting device defines a cavity in the emitting device. The encapsulant covers a lateral surface of the emitting device and exposing the second surface of the emitting device.

In accordance with some embodiments of the present disclosure, a method of manufacturing an optical module includes providing an emitting devices including a cavity in the emitting device, and building a redistribution layer on the emitting devices.

Figure 1A:
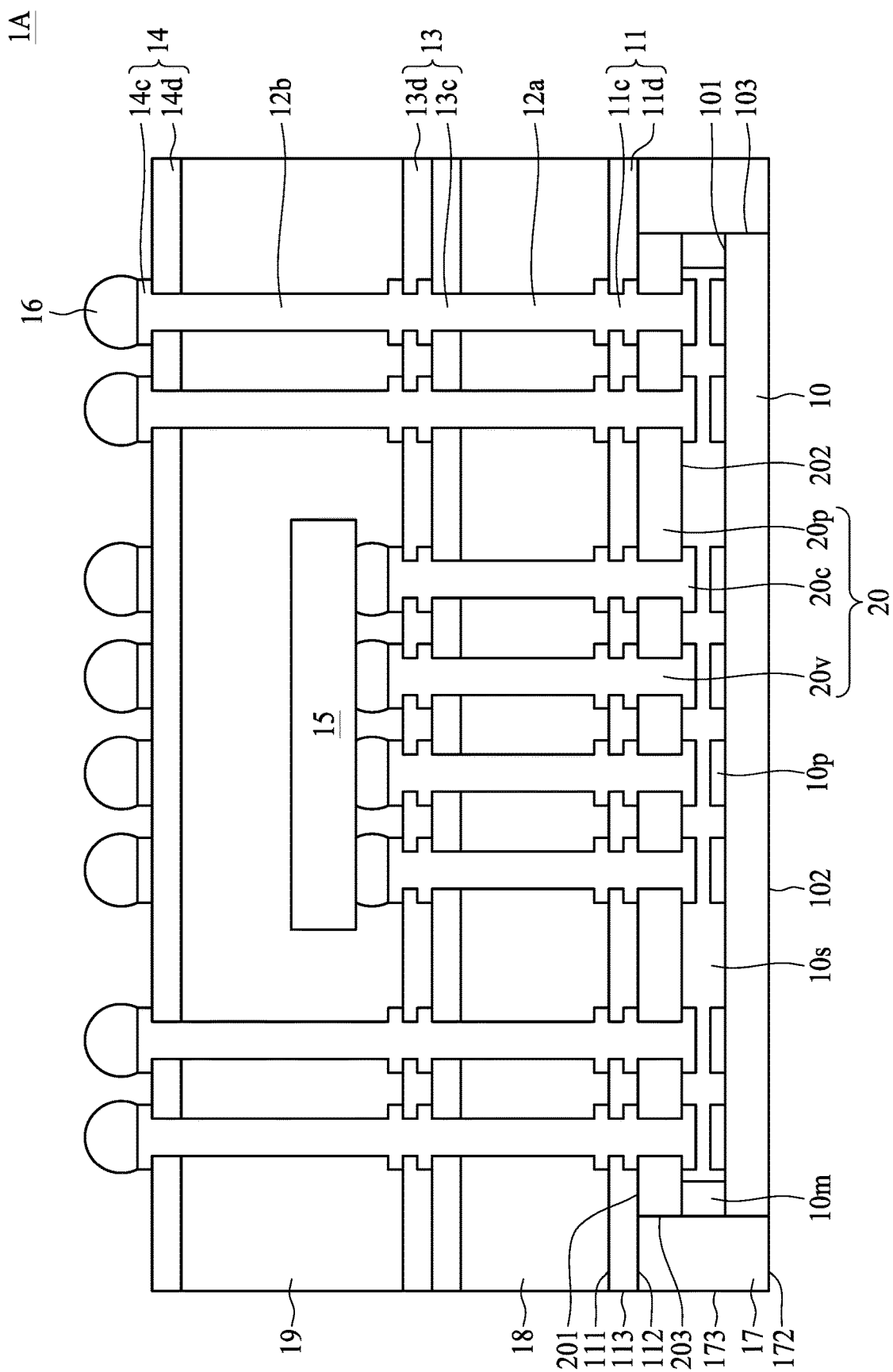
FIG. 1A illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a cross-sectional view of a semiconductor device package 1A in accordance with some embodiments of the present disclosure. The semiconductor device package 1A includes a carrier 10, circuit layers 11, 13, 14, 20, interconnection structures 12a, 12b, an electronic component 15, electrical contacts 16 and package bodies 17, 18 and 19.

In some embodiments, the carrier 10 may be or include a glass substrate. In some embodiments, the carrier 10 may be or include an emitting element having one or more emitting components (e.g., an antenna, a light emitting element, a sensor or the like) disposed thereon. The carrier 10 may include conductive pad(s), trace(s), and interconnection(s) (e.g. via(s)). In some embodiments, the carrier 10 may include transparent material. In some embodiments, the carrier 10 may include opaque material. Compared to the organic substrate, it is easier to control the thickness of a glass carrier, which can facilitate the miniaturization of the semiconductor device package 1A. The carrier 10 includes a material having a loss tangent or dissipation factor (Df) less than approximately 0.005. The carrier 10 includes a material having a loss tangent or Df less than approximately 0.003. In some embodiments, a coefficient of thermal expansion (CTE) of the carrier 10 is in a range from about 0.5 to about 13. In some embodiments, the CTE of the carrier 10 is in a range from about 3.6 to about 8.5. In some embodiments, a thickness of the carrier 10 is in a range from about 100 μm to about 200 μm.

The carrier 10 has a surface 101, a surface 102 opposite to the surface 101 and a lateral surface 103 extending between the surface 101 and the surface 102. A conductive layer 10p is disposed on the surface 101 of the carrier 10. In some embodiments, the conductive layer 10p defines a patterned antenna, such as a directional antenna, an omnidirectional antenna, an antenna array. For example, the conductive layer 10p defines a patch antenna. The conductive layer 10p is, or includes, a conductive material such as a metal or metal alloy. Examples of the conductive material include gold (Au), silver (Ag), copper (Cu), platinum (Pt), Palladium (Pd), other metal(s) or alloy(s), or a combination of two or more thereof. In some embodiments, the conductive layer 10p may be replaced by one or more light emitting elements or sensors.

The circuit layer 20 (or building-up circuit) has a surface 201 facing away from the carrier 10, a surface 202 opposite to the surface 201 and a lateral surface 203 extending between the surface 201 and the surface 202. The circuit layer 20 is disposed over the carrier 10 and spaced apart from the carrier 10 through support elements 10m. For example, the circuit layer 20, the support element 10m and the carrier 10 define a space 10s. The support elements 10m may be disposed at or adjacent to the periphery of the carrier 10. In some embodiments, the support elements 10m may be formed of or include an attach film, metal or any other suitable materials. In some embodiments, a thickness of the support elements 10m is in a range from about 100 μm to about 200 In some embodiments, a width of the circuit layer 20 is substantially the same as a width of the carrier 10. For example, the lateral surface 203 of the circuit layer 20 is substantially coplanar with the lateral surface 103 of the carrier 10. In other embodiments, the width of the circuit layer 20 may be greater to or less than the width of the carrier 10 depending on different design specifications.

Figure 1B:
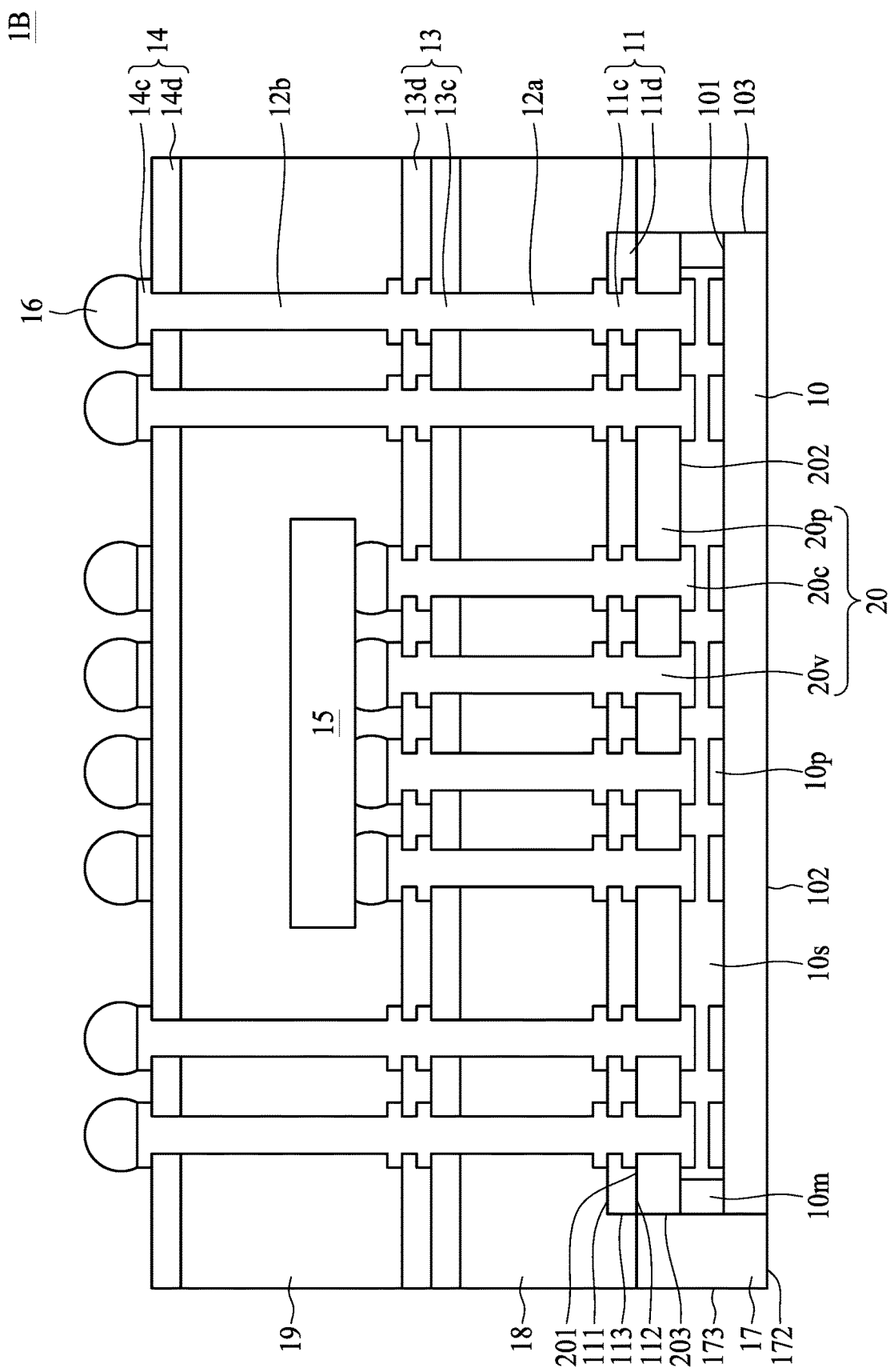
FIG. 1B illustrates a cross-sectional view of a semiconductor device package in accordance with some embodiments of the present disclosure.
Figure 1C:
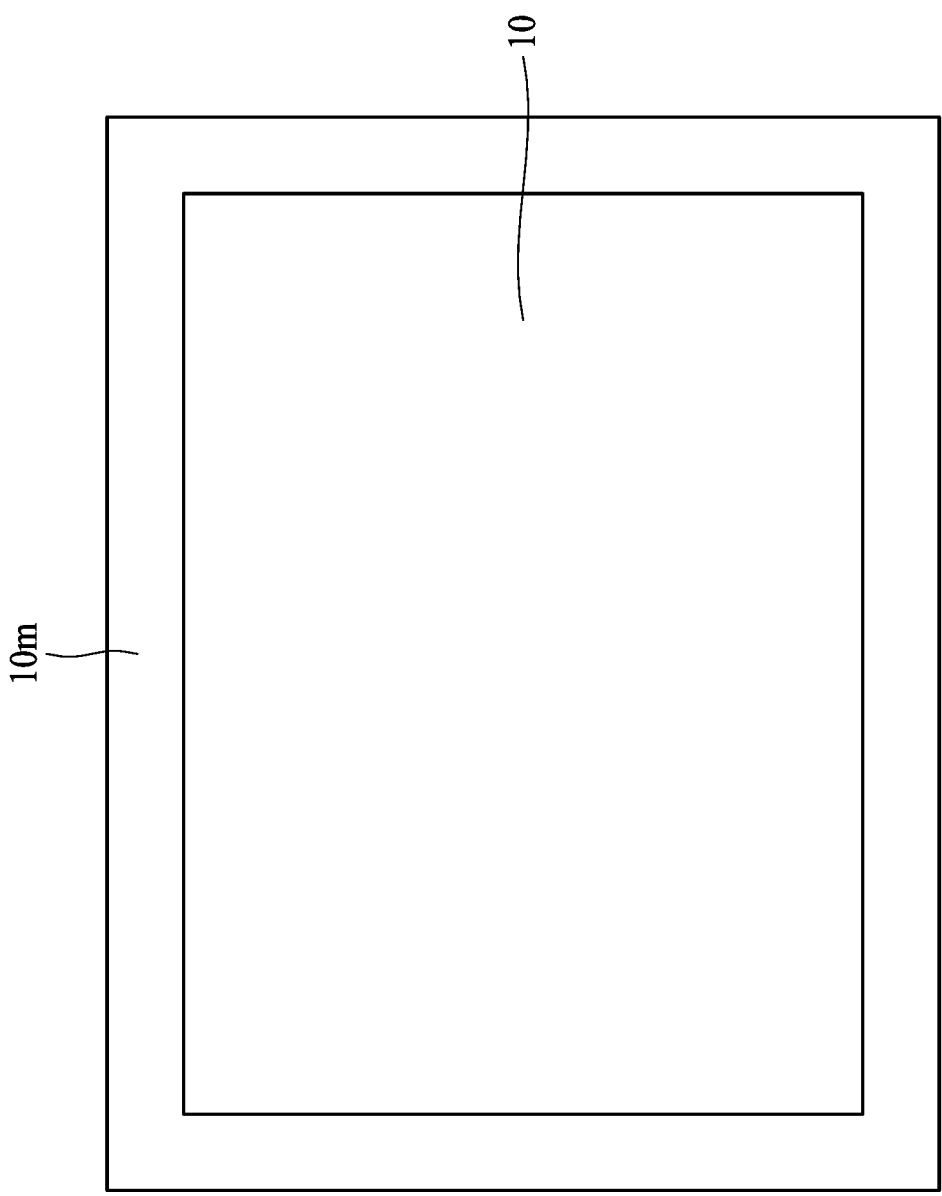
FIG. 1C illustrates a top view of a semiconductor device package in accordance with some embodiments of the present disclosure.

In some embodiments, as shown in FIG. 1C, which illustrates a top view of the support elements 10m and the carrier 10, the support elements 10m may fully surround the periphery of the carrier 10. For example, the carrier 10, the support elements 10m and the circuit layer 20 may define a sealed space 10s. This can prevent the package body 17 from entering the space 10s during the manufacturing process. In other embodiments, in the case that the package body 17 is omitted, the support elements 10m may not fully surround the periphery of the carrier 10. For example, there may be a gap between two adjacent support elements 10m or the support elements 10m may include one or more openings.

The circuit layer 20 includes one or more conductive layers (e.g., redistribution layers, RDLs or conductive vias) 20c, 20v and one or more dielectric layers 20p. A portion of the conductive layers (e.g., 20v) is covered or encapsulated by the dielectric layer 20p while another portion (e.g., 20c) of the conductive layer is exposed from the dielectric layer 20p to provide electrical connections. In some embodiments, a surface of the conductive layer 20c facing the carrier 10 and exposed from the dielectric layer 20p is within the space 10s. In some embodiments, the conductive layer 20c is patterned to be corresponding to the conductive layer 10p. For example, the conductive layer 20c is substantially aligned with the conductive layer 10p. The conductive layer 20c is spaced apart from the conductive layer 10p. The signal may be transmitted between the conductive layer 20c and the conductive layer 10p through coupling. Since there is a space 10s (e.g., air cavity) between the conductive layer 20c and the conductive layer 10p, the performance of the signal transmission between the conductive layer 20c and the conductive layer 10p can be enhanced. In some embodiments, the circuit layer 20 may act as an interposer. In some embodiments, the carrier 10, conductive layer 10p, the support elements 10m and the circuit layer 20 may be also referred to as an emitting device.

In some embodiments, the dielectric layer 20p may include polyimide (PI), pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, there may be any number of conductive layers 20c depending on design specifications. In some embodiments, the conductive layer 20c is formed of or includes Au, Ag, Cu, Pt, Pd, or an alloy thereof. In some embodiments, the dielectric layer 20p and the package body 17 may include the same material. Alternatively, the dielectric layer 20p and the package body 17 may include different materials.

The circuit layer 11 (or building-up circuit) is disposed on the circuit layer 20. The circuit layer 11 has a surface 111 facing away from the circuit layer 20, a surface 112 opposite to the surface 111 and a lateral surface 113 extending between the surface 111 and the surface 112. The circuit layer 11 is electrically connected to the circuit layer 20. The surface 112 of the circuit layer 11 is in contact with the surface 201 of the circuit layer 20. In some embodiments, the lateral surface 113 of the circuit layer 11 and the lateral surface 203 of the circuit layer 20 (or the lateral surface 103 of the carrier 10) are noncoplanar or discontinuous. For example, the lateral surface 203 of the circuit layer 20 (or the lateral surface 103 of the carrier 10) is recessed from the lateral surface 113 of the circuit layer 11. For example, a width of the circuit layer 20 or the carrier 10 is less than a width of the circuit layer 11.

The circuit layer 11 includes one or more conductive layers (e.g., redistribution layers, RDLs) 11c and one or more dielectric layers 11d. A portion of the conductive layer 11c is covered or encapsulated by the dielectric layer 11d while another portion of the conductive layer 11c is exposed from the dielectric layer 11d to provide electrical connections. In some embodiments, a surface of the conductive layer 11c facing the circuit layer 20 and exposed from the dielectric layer 11d is in contact with the surface 201 of the circuit layer 20. In some embodiments, the conductive layer 11c may be or include one or more antenna patterns, light elements, sensors or the like.

In some embodiments, the dielectric layer 11d may include PI, pre-impregnated composite fibers (e.g., pre-preg), BPSG, silicon oxide, silicon nitride, silicon oxynitride, USG, any combination of two or more thereof, or the like. Examples of a pre-preg may include, but are not limited to, a multi-layer structure formed by stacking or laminating a number of pre-impregnated materials/sheets. In some embodiments, there may be any number of conductive layers 11c depending on design specifications. In some embodiments, the conductive layer 11c is formed of or includes Au, Ag, Cu, Pt, Pd, or an alloy thereof.

The package body 17 is disposed on the surface 112 of the circuit layer 11. The package body 17 covers the carrier 10, the support elements 10m and the circuit layer 20. The package body 17 covers the lateral surface 103 of the carrier 10, a lateral surface of the support elements 10m and the lateral surface 203 of the circuit layer 20. The surface 102 of the carrier 10 is exposed from the package body 17. For example, the surface 102 of the carrier 10 is substantially coplanar with a surface 172 of the package body 17. In some embodiments, the package body 17 has a lateral surface 173 substantially coplanar with the lateral surface 113 of the circuit layer 11. The lateral surface 103 of the carrier 10 and the lateral surface 203 of the circuit layer 20 are recessed from the lateral surface 173 of the package body 17. For example, there is a distance between the lateral surface 103 of the carrier 10 (or the lateral surface 203 of the circuit layer 20) and the lateral surface 173 of the package body 17. In some embodiments, the package body 17 includes an epoxy resin including fillers, a molding compound (e.g., an epoxy molding compound or other molding compound), a PI, a phenolic compound or material, a material including a silicone dispersed therein, or a combination thereof.

One or more interconnection structures 12a (e.g., conductive pillars or conductive elements) are disposed on the surface 111 of the circuit layer 11. The interconnection structures 12a are electrically connected to the circuit layer 11 (i.e., to the conductive layer 11c exposed from the dielectric layer 11d). In some embodiments, the interconnection structures 12a define an antenna structure. The interconnection structure 12a is, or includes, a conductive material such as a metal or metal alloy. Examples of the conductive material include Au, Ag, Cu, Pt, Pd, or an alloy thereof.

The package body 18 is disposed on the surface 111 of the circuit layer 11. The package body 18 covers the interconnection structures 12a. In some embodiments, the package body 18 has a lateral surface 183 substantially coplanar with the lateral surface 113 of the circuit layer 11. In some embodiments, the package body 18 includes an epoxy resin including fillers, a molding compound (e.g., an epoxy molding compound or other molding compound), a PI, a phenolic compound or material, a material including a silicone dispersed therein, or a combination thereof.

The circuit layer 13 (or building-up circuit) is disposed on the package body 18. The circuit layer 13 has one or more dielectric layers 13d and one or more conductive layers 13c. In some embodiments, the dielectric layer 13d may include the same material as the dielectric layer 11d. Alternatively, the dielectric layer 13d and the dielectric layer 11d may include different materials. The conductive layer 13c is electrically connected to the interconnection structures 12a. In some embodiments, there may be any number of conductive layers 13c depending on design specifications.

One or more interconnection structures 12b (e.g., conductive pillars or conductive elements) are disposed on a surface of the circuit layer 13 facing away from the circuit layer 11. The interconnection structures 12b are electrically connected to the circuit layer 13. The interconnection structure 12b is, or includes, a conductive material such as a metal or metal alloy. Examples of the conductive material include Au, Ag, Cu, Pt, Pd, or an alloy thereof.

The electronic component 15 is disposed on a surface of the circuit layer 13 facing away from the circuit layer 11. The electronic component 15 may be an active electronic component, such as an integrated circuit (IC) chip or a die. The active surface of the electronic component 15 faces the circuit layer 13. The electronic component 15 is electrically connected to the circuit layer 13 (e.g., to the conductive layer 13c) through electrical contacts (e.g., solder balls), and the electrical connection can be achieved by, for example, flip-chip technique.

The package body 19 is disposed on the surface of the circuit layer 13 facing away from the circuit layer 11. The package body 19 covers the interconnection structures 12b and the electronic component 15. In some embodiments, the package body 19 has a lateral surface substantially coplanar with the lateral surface of the circuit layer 13. In some embodiments, the package body 19 includes an epoxy resin including fillers, a molding compound (e.g., an epoxy molding compound or other molding compound), a PI, a phenolic compound or material, a material including a silicone dispersed therein, or a combination thereof.

The circuit layer 14 (or building-up circuit) is disposed on the package body 19. The circuit layer 14 has one or more dielectric layers 14d and one or more conductive layers 14c. In some embodiments, the dielectric layer 14d may include the same material as the dielectric layer 11d. Alternatively, the dielectric layer 14d and the dielectric layer 11d may include different materials. The conductive layer 14c is electrically connected to the interconnection structures 12b. In some embodiments, there may be any number of conductive layers 14c depending on design specifications.

The electrical contacts 16 are disposed on the conductive layer 14c exposed from the dielectric layer 14d. In some embodiments, the electrical contacts 16 may include solder or other suitable material(s).

In some embodiments, the lateral surface 103 of the carrier 10 may be coplanar with the lateral surface 113 of the circuit layer 11. For example, the lateral surface 103 of the carrier 10 is exposed from the package body 17. Such a structure may be formed by: (i) providing a glass wafer; (ii) forming the circuit layers 11, 13, 14, the interconnection structures 12a, 12b, the package bodies 17, 18, 19 and the electronic component 15 on the glass wafer; and (iii) performing a singulation through the circuit layers 11, 13, 14, the package bodies 17, 18, 19 and the carrier wafer. To meet the requirement of the performance of the antenna structure, the glass wafer should select a material having a relatively low Dk (e.g., less than 5). However, a glass wafer having a relatively low Dk would have a relatively low CTE as well (e.g., less than 13). Due to a CTE mismatch between the glass wafer and the package body 17 (e.g., the package body generally has a CTE greater than 20), warpage issues would occur. As the size of the glass wafer increases, warpage issues become more severe, which may result in cracks or damage to the glass wafer.

In accordance with the embodiments as shown in FIG. 1A, the lateral surface 103 of the carrier 10 is recessed from the lateral surface 111 of the circuit layer 11. Such a structure may be formed by (detailed operations will be described later): (i) performing a singulation for a glass wafer to divide the glass wafer into a plurality glass carriers (e.g., the carrier 10 as shown in FIG. 1A); (ii) attaching the glass carriers on a release film (the glass carriers being separated from each other), each glass carrier having a support element thereon and a circuit on the support element to define a cavity; and (iii) forming the circuit layers 11, 13, 14, the interconnection structures 12a, 12b, the package bodies 17, 18, 19 and the electronic component 15 on the glass carriers. Since the size of the divided glass carrier is much less than that of the glass wafer, warpage issues can be significantly mitigated. In addition, since the signal is transmitted between the conductive layer 10p and the conductive layer 20c through air (e.g., 10s) rather than the carrier 10, it is unnecessary to select low-Dk materials for the carrier 10. This can increase the flexibility in choosing materials for the carrier 10 to meet other requirements (e.g., low Df, high hardness or high CTE) to improve the electrical or structural performance of the semiconductor device package 1A.

FIG. 1B illustrates a cross-sectional view of a semiconductor device package 1B in accordance with some embodiments of the present disclosure. The semiconductor device package 1B is similar to the semiconductor device package 1A as shown in FIG. 1A, and the differences therebetween are described below.

The lateral surface 113 of the circuit layer 11 is recessed from the lateral surface 173 of the package body 17 or the lateral surface 183 of the package body 18. For example, there is a gap between the lateral surface 113 of the circuit layer 11 and the lateral surface of the lateral surface 183 of the package body 18. For example, the lateral surface 113 of the circuit layer 11 is covered by the package body 18. For example, a width of the circuit layer 11 is less than a width of the package body 18. The package body 18 may directly contact the package body 17.

In some embodiments, the lateral surface 113 of the circuit layer 11 may be substantially coplanar with the lateral surface 203 of the circuit layer 20 as shown in FIG. 1B. For example, a width of the circuit layer 11 is substantially the same as a width of the circuit layer 20. In some embodiments, the lateral surface 113 of the circuit layer 11 is noncoplanar with the lateral surface 203 of the circuit layer 20 and the lateral surface 183 of the package body 18. For example, a width of the circuit layer 11 is greater than a width of the circuit layer 20 and less than a width of the package body 18.

Figure 2:
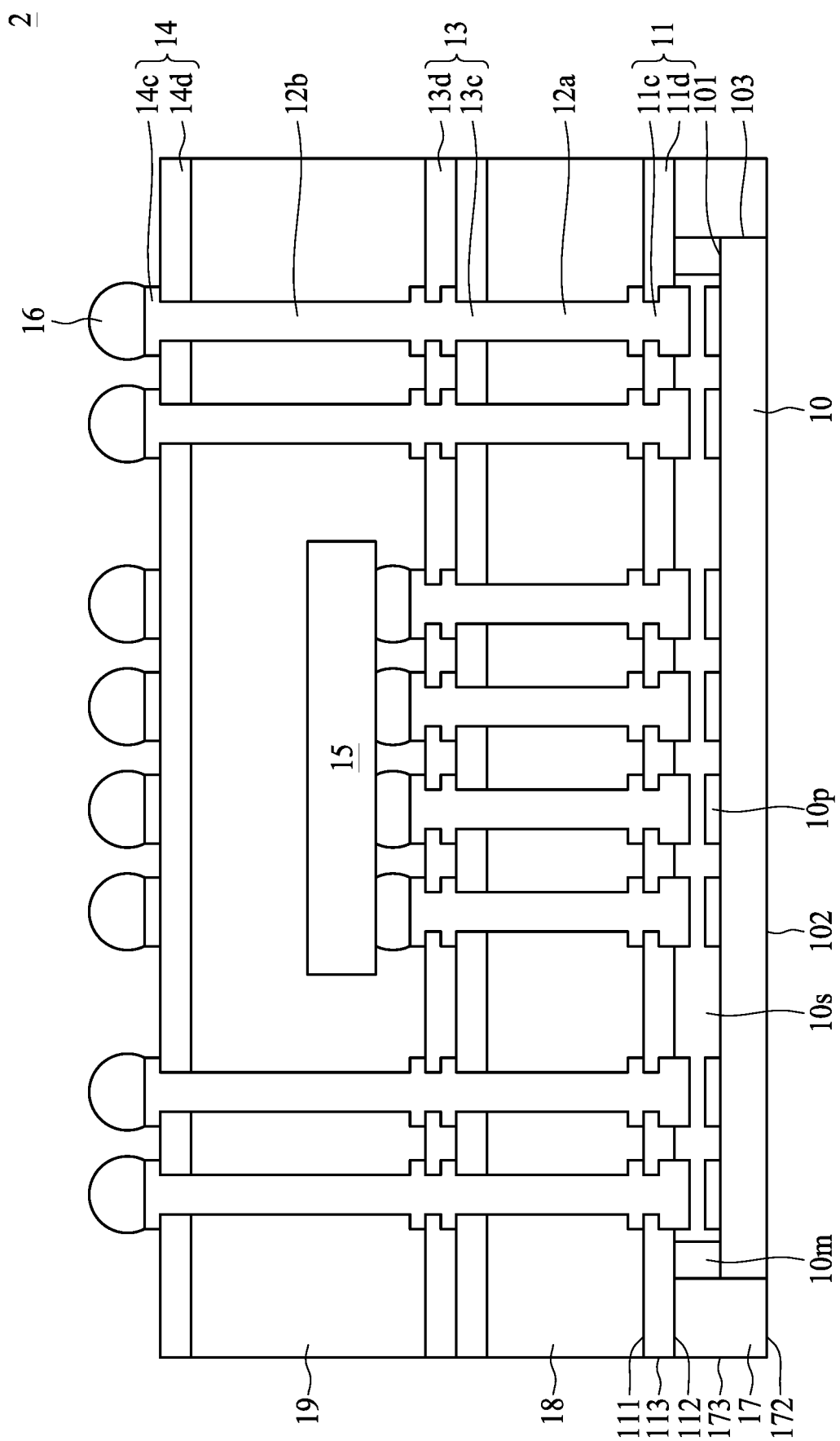
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1A as shown in FIG. 1A, except that in the semiconductor device package 2, the circuit layer 20 is omitted.

A surface of the conductive layer 11c facing the carrier 10 and exposed from the dielectric layer 11d is within the space 10s. In some embodiments, the exposed portion of the conductive layer 11c is patterned to be corresponding to the conductive layer 10p. For example, the conductive layer 11c is substantially aligned with the conductive layer 10p. The conductive layer 11c is spaced apart from the conductive layer 10p. The signal may be transmitted between the conductive layer 11c and the conductive layer 10p through coupling.

Figure 3A:
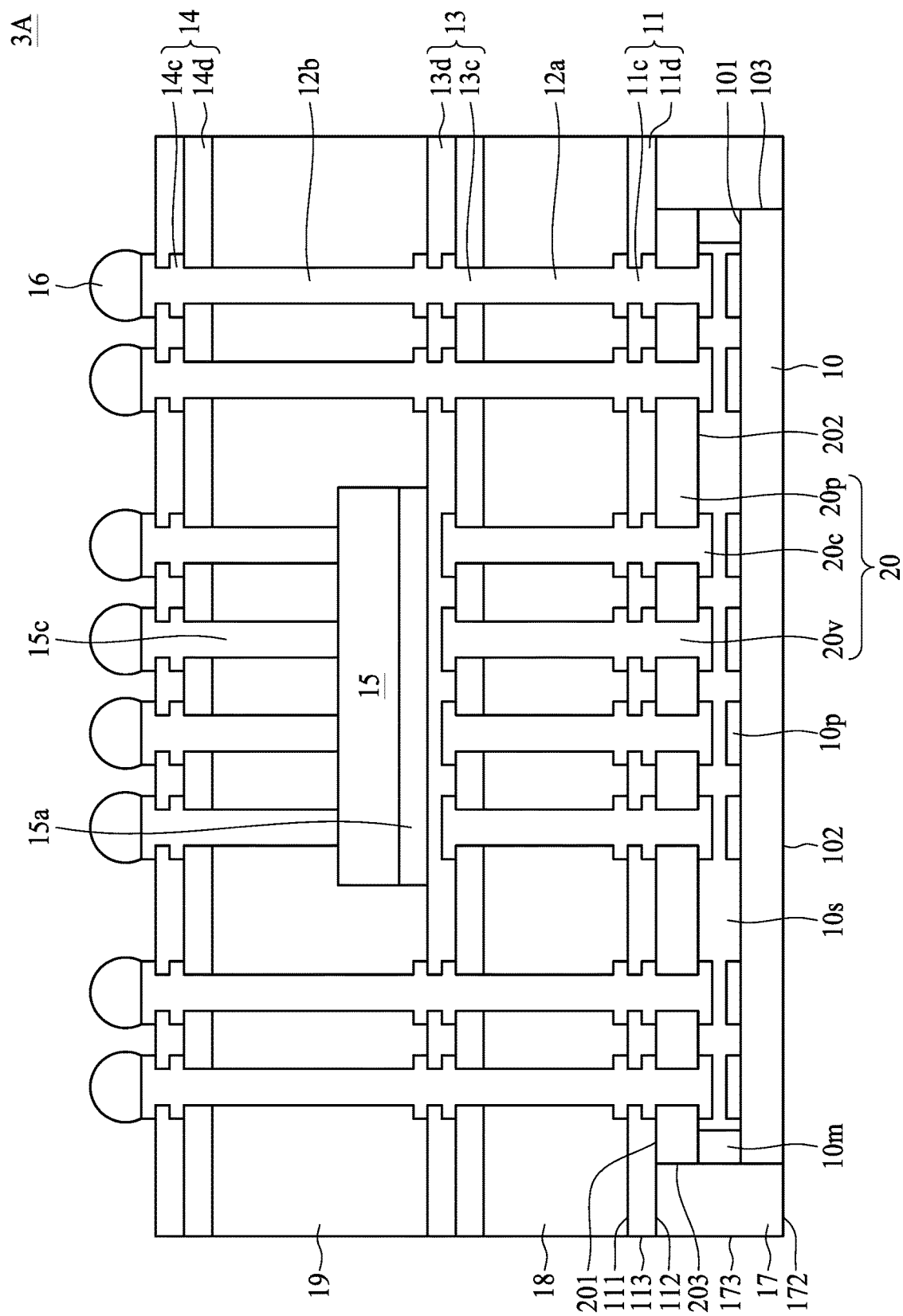
FIG. 3A illustrates a cross-sectional view of a semiconductor device package in accordance with some embodiments of the present disclosure.

FIG. 3A illustrates a cross-sectional view of a semiconductor device package 3A in accordance with some embodiments of the present disclosure. The semiconductor device package 3A is similar to the semiconductor device package 1A as shown in FIG. 1A, and the differences therebetween are described below.

The electronic component 15 is disposed on the surface of the circuit layer 13 facing the circuit layer 14. The electronic component 15 has a backside surface bonded or attached to the surface of the circuit layer 13 by an adhesion layer 15a (e.g., die attach film, DAF). The electronic component 15 has an active surface facing the circuit layer 14 and electrically connected to the circuit layer 14 through the interconnection structures 15c (e.g., conducive pillars).

Figure 3B:
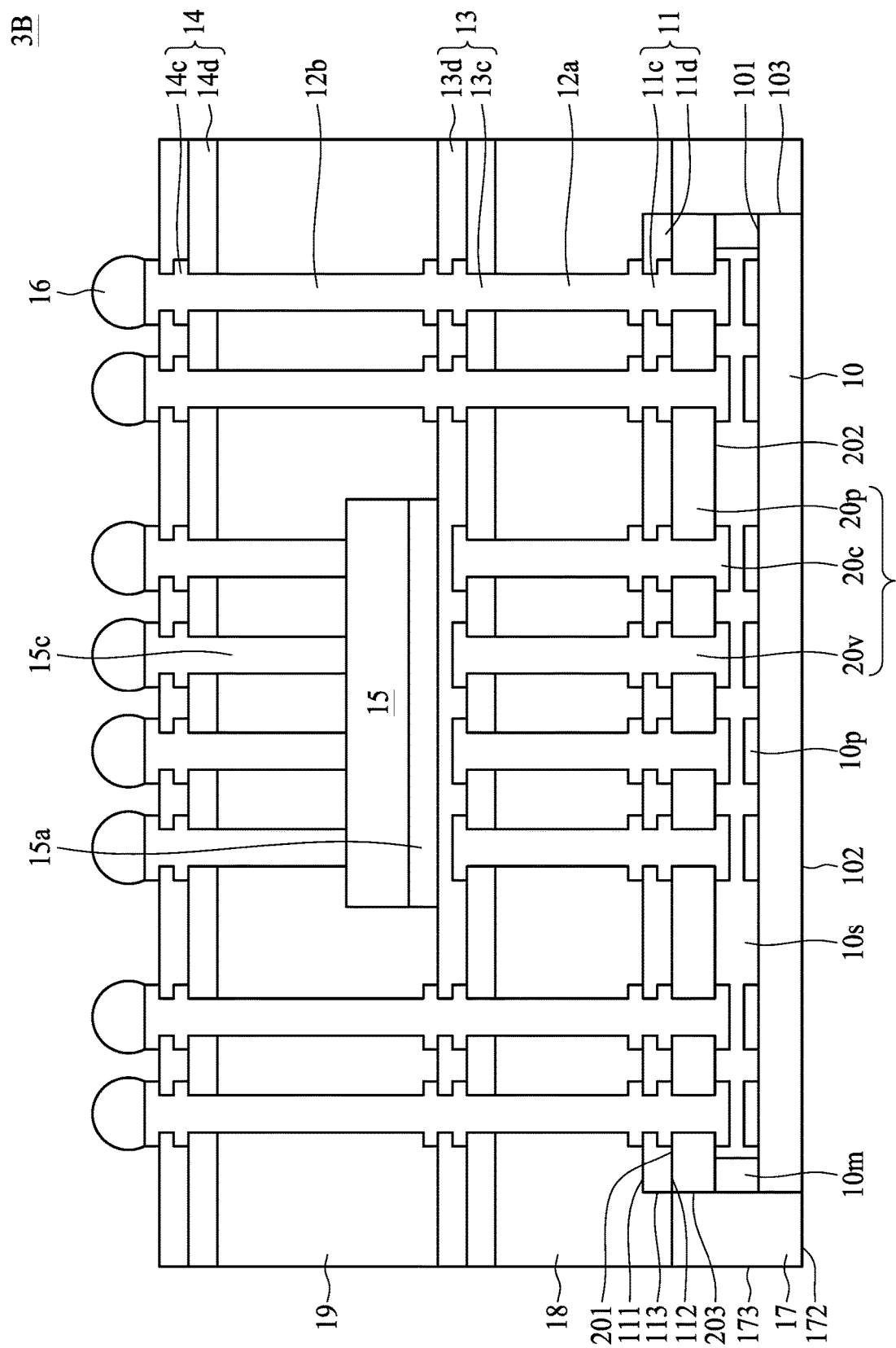
FIG. 3B illustrates a cross-sectional view of a semiconductor device package in accordance with some embodiments of the present disclosure.

FIG. 3B illustrates a cross-sectional view of a semiconductor device package 3B in accordance with some embodiments of the present disclosure. The semiconductor device package 3B is similar to the semiconductor device package 1B as shown in FIG. 1B, and the differences therebetween are described below.

The electronic component 15 is disposed on the surface of the circuit layer 13 facing the circuit layer 14. The electronic component 15 has a backside surface bonded or attached to the surface of the circuit layer 13 by an adhesion layer 15a (e.g., DAF). The electronic component 15 has an active surface facing the circuit layer 14 and electrically connected to the circuit layer 14 through the interconnection structures 15c (e.g., conducive pillars).

Figure 4A:
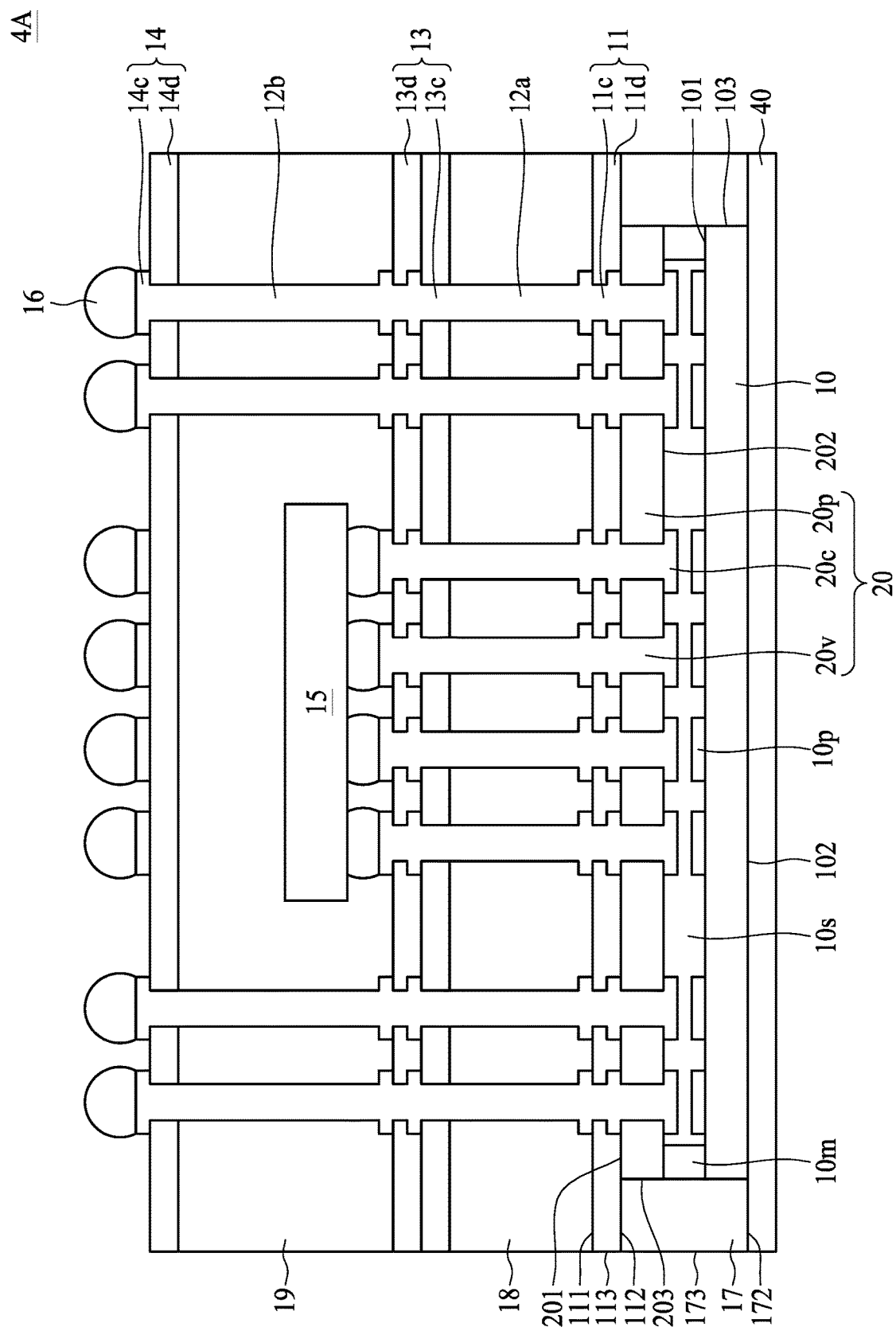
FIG. 4A illustrates a cross-sectional view of a semiconductor device package in accordance with some embodiments of the present disclosure.

FIG. 4A illustrates a cross-sectional view of a semiconductor device package 4A in accordance with some embodiments of the present disclosure. The semiconductor device package 4A is similar to the semiconductor device package 1A as shown in FIG. 1A, except that the semiconductor device package 4A further includes a protection layer 40. The protection layer 40 is disposed on the surface 172 of the package body 17 and the surface 102 of the carrier 10. The protection layer 40 covers the surface 172 of the package body 17 and the surface 102 of the carrier 10.

Figure 4B:
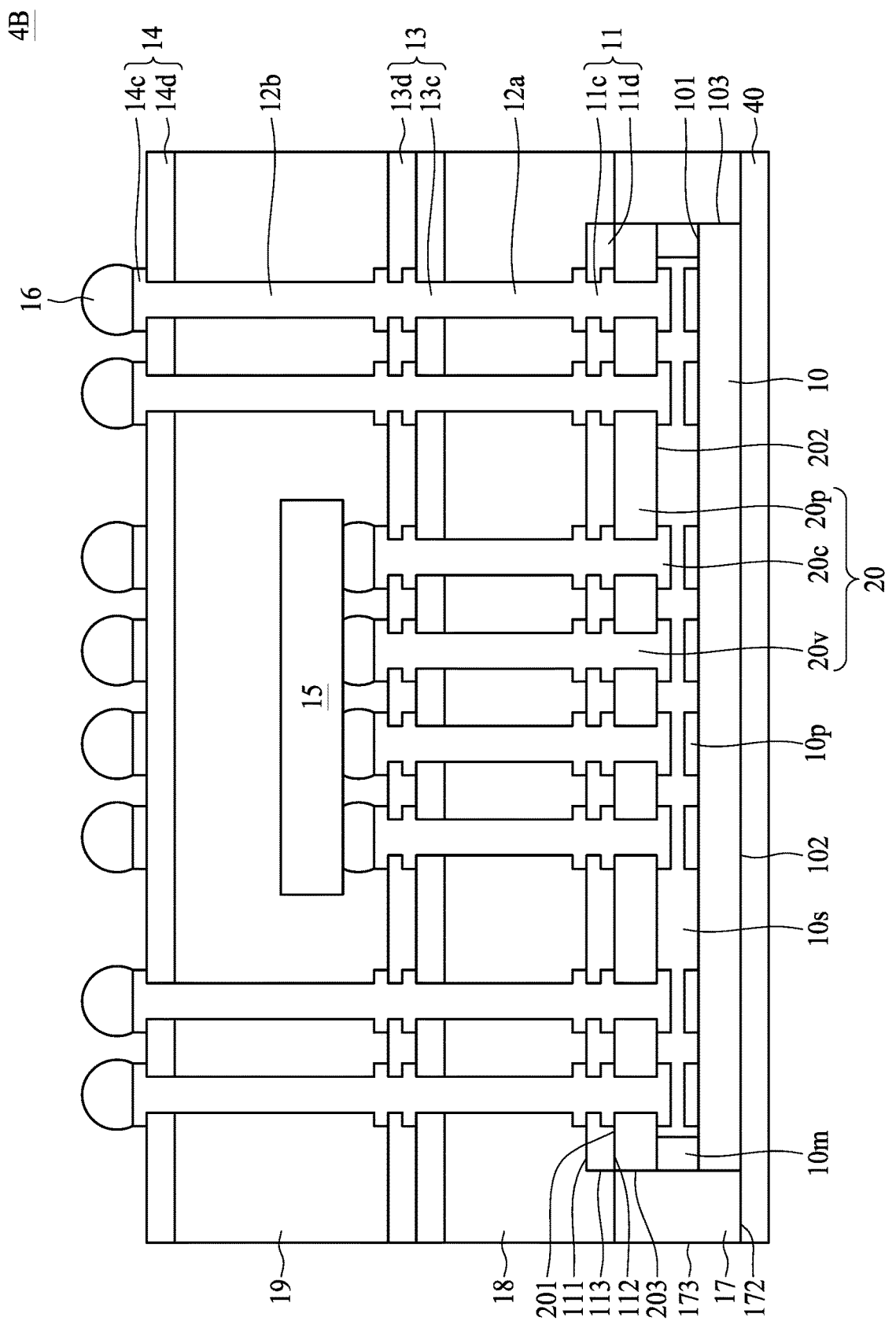
FIG. 4B illustrates a cross-sectional view of a semiconductor device package in accordance with some embodiments of the present disclosure.

FIG. 4B illustrates a cross-sectional view of a semiconductor device package 4B in accordance with some embodiments of the present disclosure. The semiconductor device package 4B is similar to the semiconductor device package 1B as shown in FIG. 1B, except that the semiconductor device package 4B further includes a protection layer 40. The protection layer 40 is disposed on the surface 172 of the package body 17 and the surface 102 of the carrier 10. The protection layer 40 covers the surface 172 of the package body 17 and the surface 102 of the carrier 10.

Figure 4C:
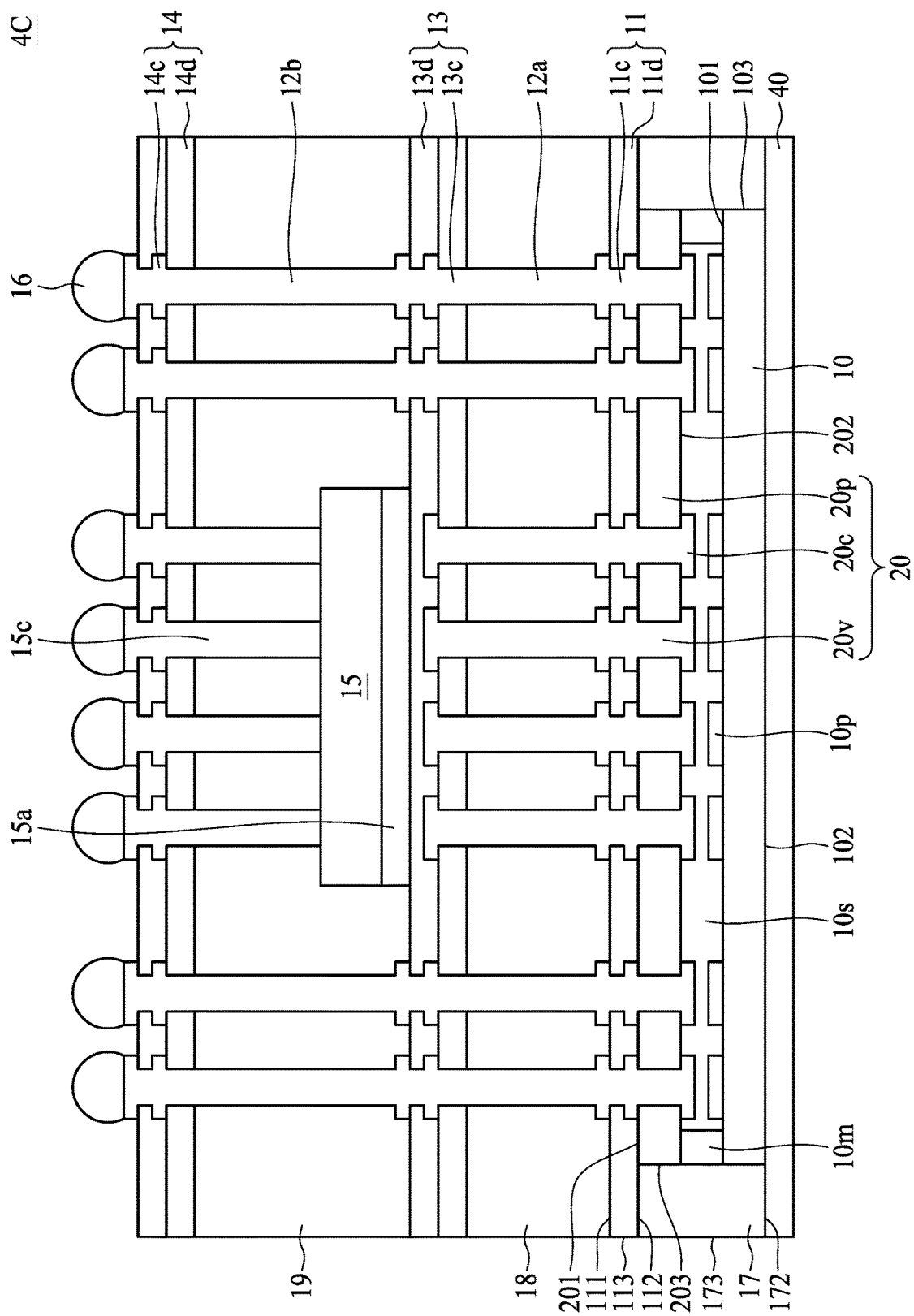
FIG. 4C illustrates a cross-sectional view of a semiconductor device package in accordance with some embodiments of the present disclosure.

FIG. 4C illustrates a cross-sectional view of a semiconductor device package 4C in accordance with some embodiments of the present disclosure. The semiconductor device package 4C is similar to the semiconductor device package 3A as shown in FIG. 3A, except that the semiconductor device package 4C further includes a protection layer 40. The protection layer 40 is disposed on the surface 172 of the package body 17 and the surface 102 of the carrier 10. The protection layer 40 covers the surface 172 of the package body 17 and the surface 102 of the carrier 10.

Figure 4D:
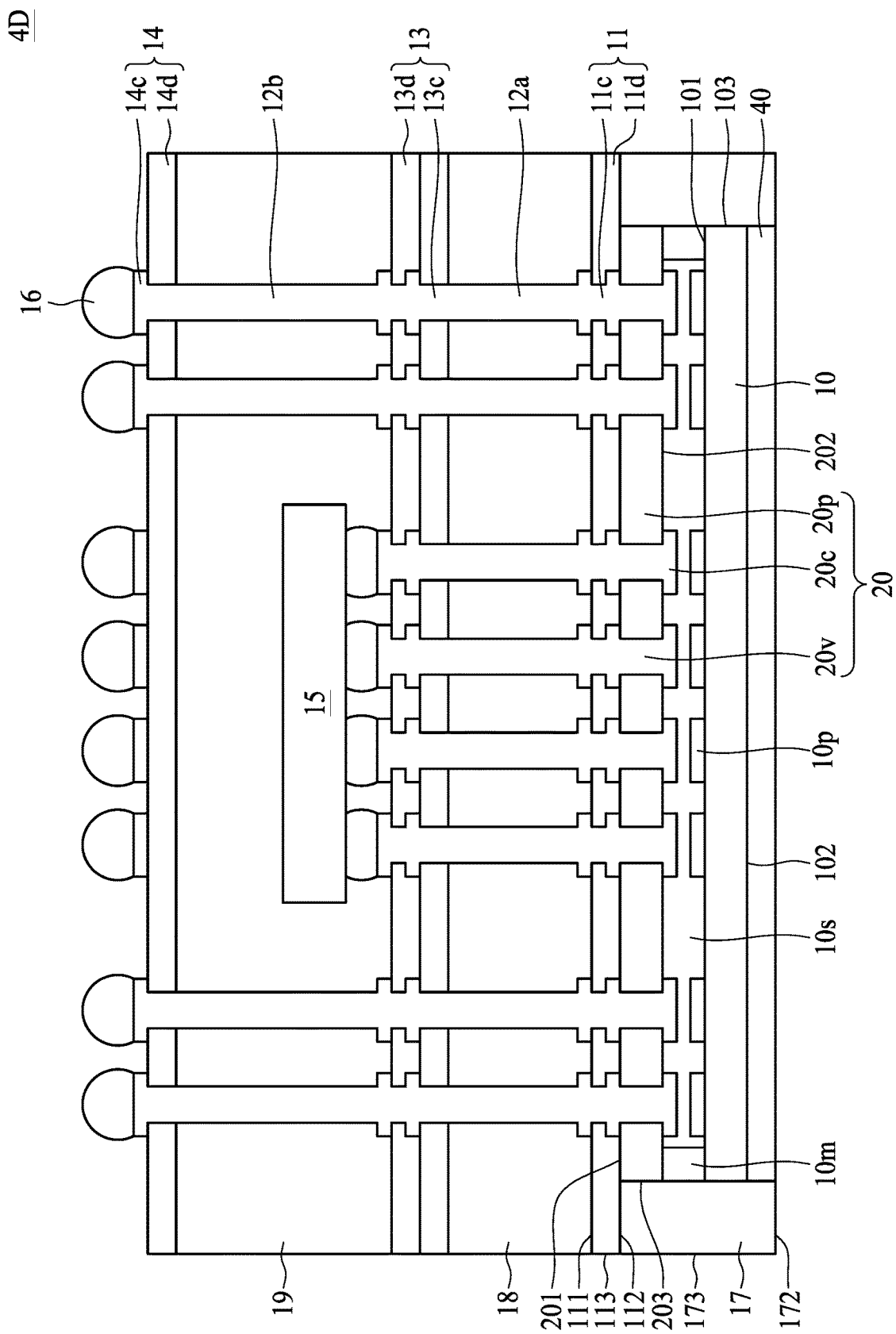
FIG. 4D illustrates a cross-sectional view of a semiconductor device package in accordance with some embodiments of the present disclosure.

FIG. 4D illustrates a cross-sectional view of a semiconductor device package 4D in accordance with some embodiments of the present disclosure. The semiconductor device package 4D is similar to the semiconductor device package 4A as shown in FIG. 4A, and the differences therebetween are described below.

The protection layer 40 is disposed on the surface 102 of the carrier 10. The protection layer 40 covers the surface 102 of the carrier 10. A width of the protection layer 40 is substantially the same as a width of the carrier 10. The protection layer 40 is disposed within the package body 17. The package body 17 covers a lateral surface of the protection layer 40. A lower surface of the protection layer 40 is substantially coplanar with the surface 172 of the package body.

Figure 4E:
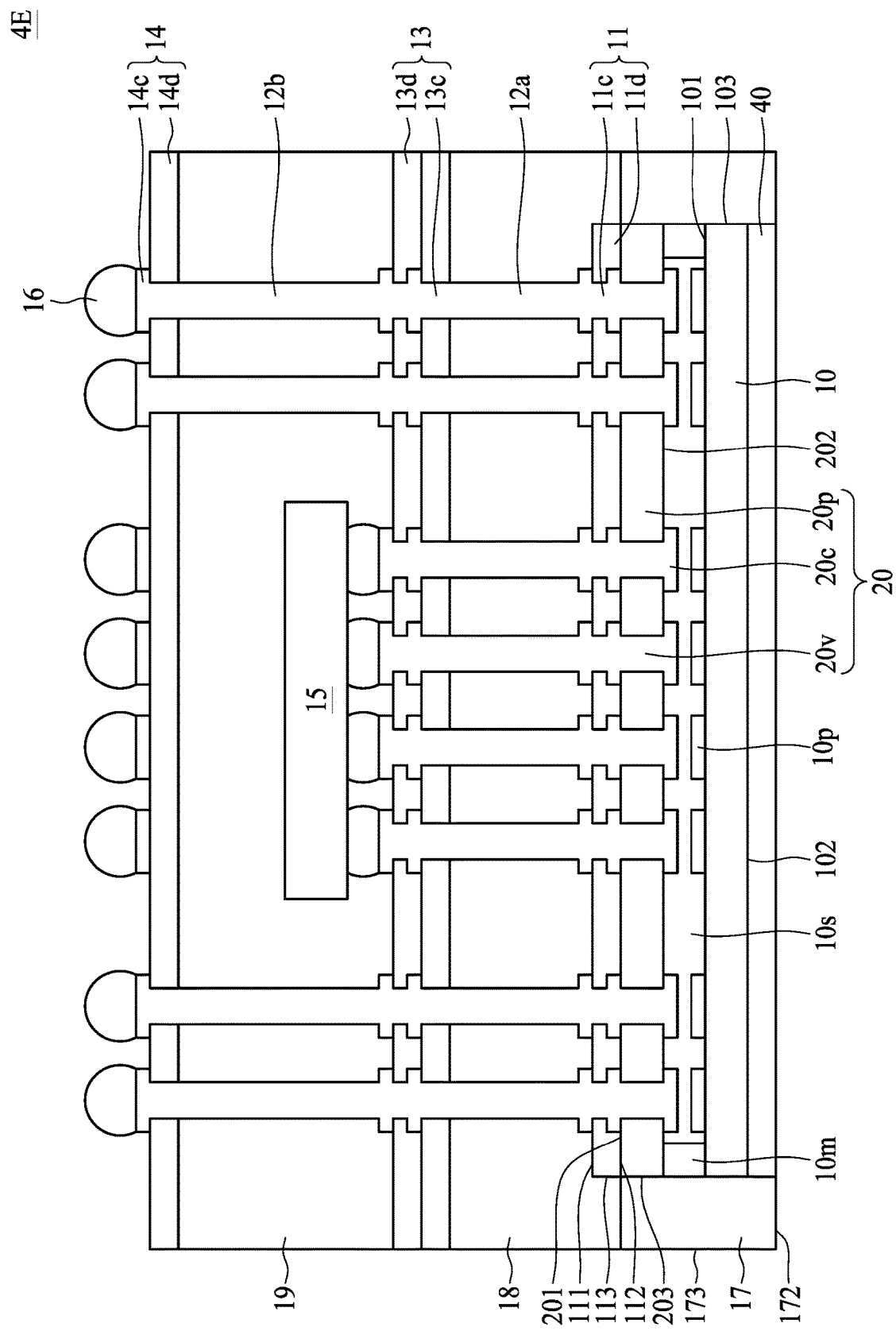
FIG. 4E illustrates a cross-sectional view of a semiconductor device package in accordance with some embodiments of the present disclosure.

FIG. 4E illustrates a cross-sectional view of a semiconductor device package 4E in accordance with some embodiments of the present disclosure. The semiconductor device package 4E is similar to the semiconductor device package 4B as shown in FIG. 4B, and the differences therebetween are described below.

The protection layer 40 is disposed on the surface 102 of the carrier 10. The protection layer 40 covers the surface 102 of the carrier 10. A width of the protection layer 40 is substantially the same as a width of the carrier 10. The protection layer 40 is disposed within the package body 17. The package body 17 covers a lateral surface of the protection layer 40. A lower surface of the protection layer 40 is substantially coplanar with the surface 172 of the package body.

Figure 4F:
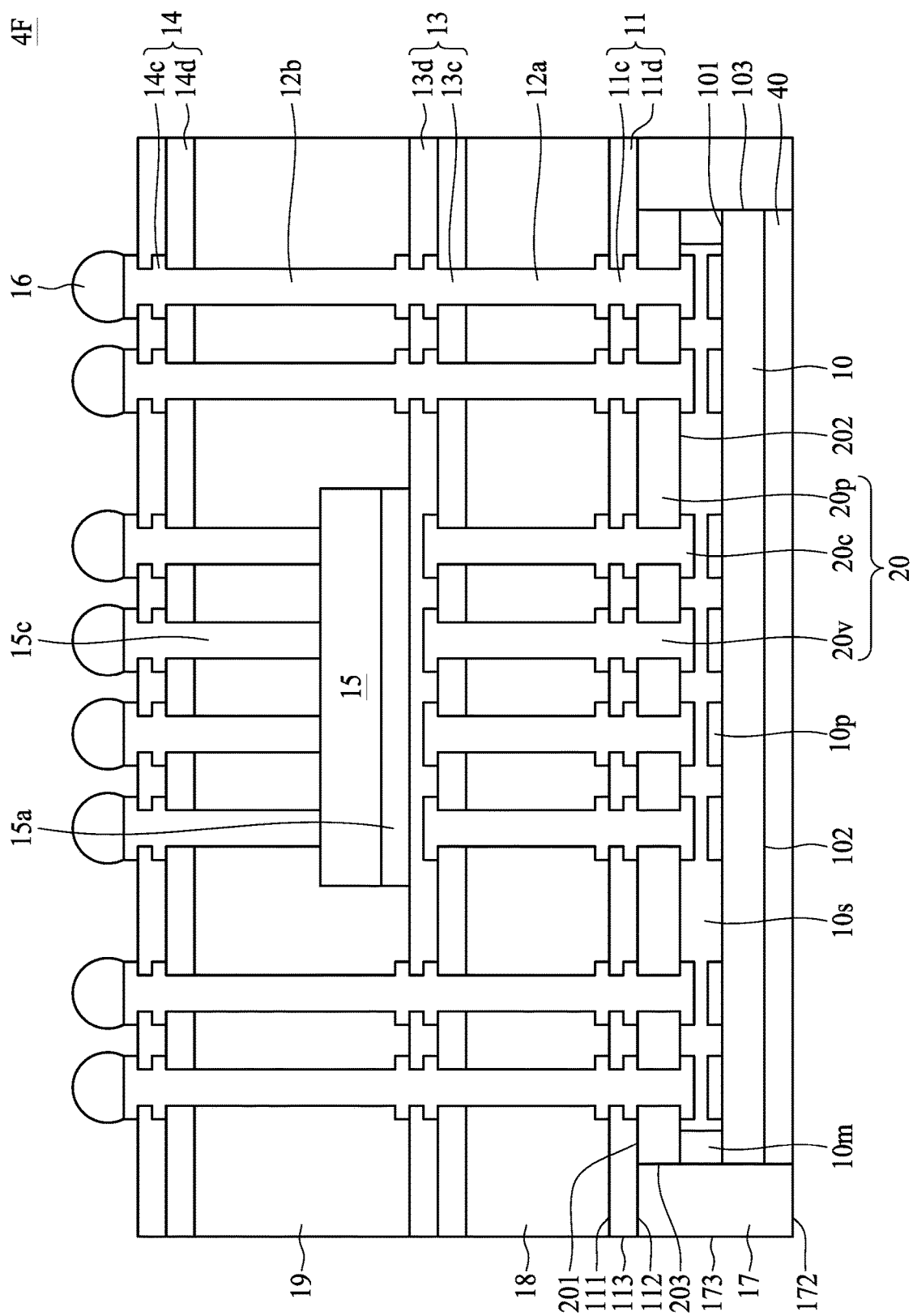
FIG. 4F illustrates a cross-sectional view of a semiconductor device package in accordance with some embodiments of the present disclosure.

FIG. 4F illustrates a cross-sectional view of a semiconductor device package 4F in accordance with some embodiments of the present disclosure. The semiconductor device package 4F is similar to the semiconductor device package 4C as shown in FIG. 4C, and the differences therebetween are described below.

The protection layer 40 is disposed on the surface 102 of the carrier 10. The protection layer 40 covers the surface 102 of the carrier 10. A width of the protection layer 40 is substantially the same as a width of the carrier 10. The protection layer 40 is disposed within the package body 17. The package body 17 covers a lateral surface of the protection layer 40. A lower surface of the protection layer 40 is substantially coplanar with the surface 172 of the package body.

Figure 5A:
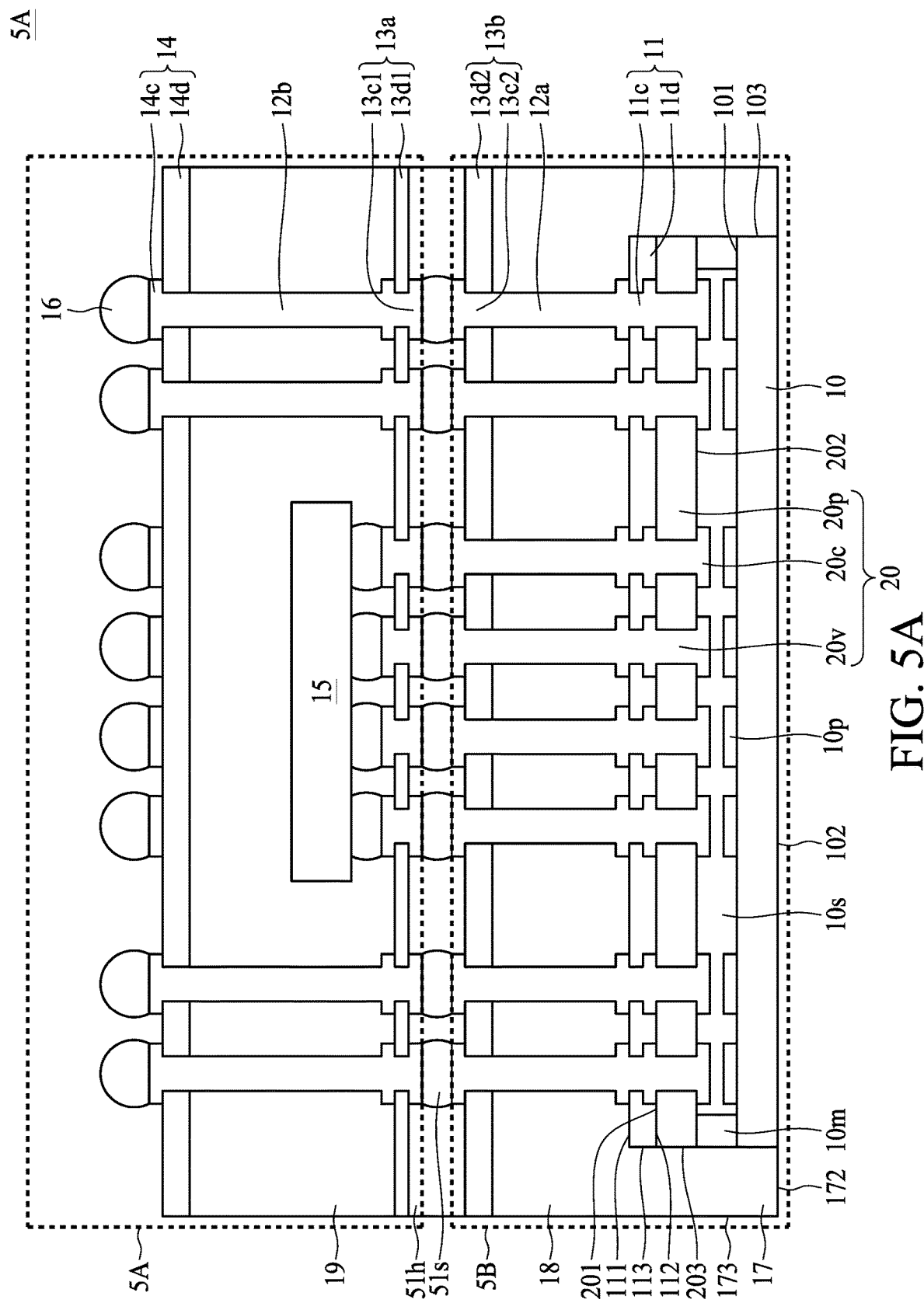
FIG. 5A illustrates a cross-sectional view of a semiconductor device package in accordance with some embodiments of the present disclosure.

FIG. 5A illustrates a cross-sectional view of a semiconductor device package 5A in accordance with some embodiments of the present disclosure. The semiconductor device package 5A is similar to the semiconductor device package 1A as shown in FIG. 1A, and the differences therebetween are described below.

The semiconductor device package 5A may include two parts 5A and 5B. The part 5A includes a circuit layer 13a including one or more dielectric layers 13d1 and one or more conductive layers 13c1, the package body 19, the electronic component 15, the circuit layer 14, and the interconnection structures 12b. The part 5B includes a circuit layer 13b including one or more dielectric layers 13d2 and one or more conductive layers 13c2, the package bodies 17, 18, the circuit layers 11, 20 and the carrier 10. The part 5A and the part 5B may be manufactured individually and then connected to each other through electrical contacts 51s (e.g., solder balls). This would increase the yield rate of the semiconductor device package 5A. In some embodiments, an underfill 51h may be disposed between the part 5A and the part 5B to cover the electrical contacts 51s. In some embodiments, a width of the part 5A is the same as a width of the part 5B. Alternatively, the width of the part 5A may be greater than or less than the width of the part 5B depending on design specifications.

Figure 5B:
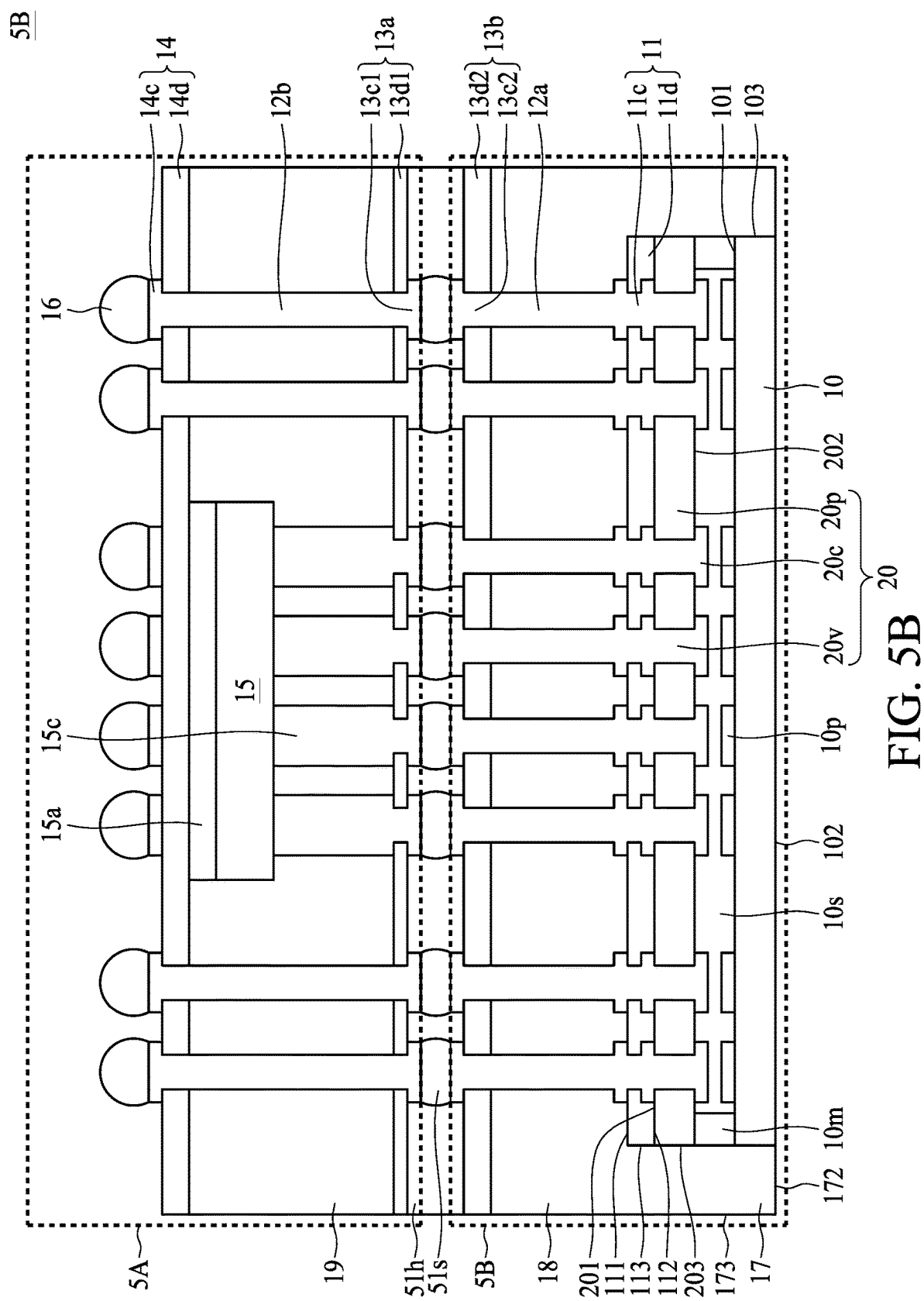
FIG. 5B illustrates a cross-sectional view of a semiconductor device package in accordance with some embodiments of the present disclosure.

FIG. 5B illustrates a cross-sectional view of a semiconductor device package 5B in accordance with some embodiments of the present disclosure. The semiconductor device package 5B is similar to the semiconductor device package 5A as shown in FIG. 5A, and the differences therebetween are described below.

The electronic component 15 is disposed on the surface of the circuit layer 14 facing the circuit layer 13a. The electronic component 15 has a backside surface bonded or attached to the surface of the circuit layer 14 by an adhesion layer 15a (e.g., DAF). The electronic component 15 has an active surface facing the circuit layer 13a and electrically connected to the circuit layer 13a through the interconnection structures 15c (e.g., conduvice pillars).

FIG. 6A, FIG. 6B, FIG. 6C, FIG. 6D, FIG. 6E and FIG. 6F illustrate a semiconductor manufacturing method in accordance with some embodiments of the present disclosure. In some embodiments, the method in FIG. 6A, FIG. 6B, FIG. 6C, FIG. 6D, FIG. 6E and FIG. 6F can be used to manufacture the semiconductor device package 1A in FIG. 1A.

Figure 6A:
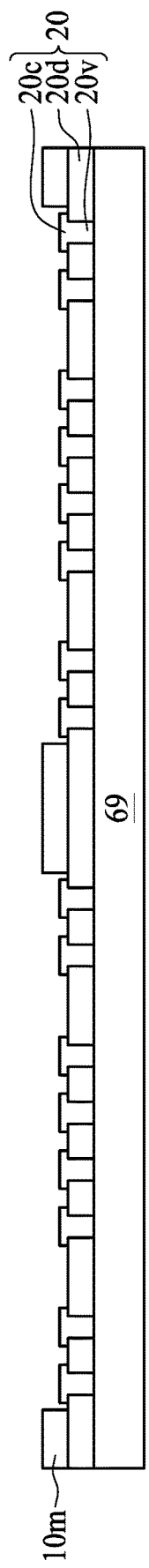
FIG. 6A, FIG. 6B, FIG. 6C, FIG. 6D, FIG. 6E and FIG. 6F illustrate a semiconductor manufacturing method in accordance with some embodiments of the present disclosure.

Referring to FIG. 6A, a carrier 69 is provided. A circuit layer 20 including one or more conductive layers 20c, 20v and one or more dielectric layers 20p is formed on the carrier 69. A portion of the conductive layers (e.g., the conductive layer 20c) is exposed from the dielectric layer 20p. In some embodiments, the conductive layers 20c, 20v may be antenna patterns, light elements or sensors. Support elements 10m are formed on the circuit layer 20 (e.g., on the dielectric layer 20p of the circuit layer 20). In some embodiments, the circuit layer 20 may be formed by fan-out process, bumping process or other suitable lithographic processes. For example, the circuit layer 20 may be formed by: (i) forming the dielectric layer 20p by a coating operation; and (ii) forming the conductive layers 20c, 20v by an exposure operation, a development operation, a plating operation and the like. In some embodiments, the conductive layers 20v may be a conductive material formed in a via of the dielectric layer 20p. The via may be formed by photolithography process.

Figure 6B:
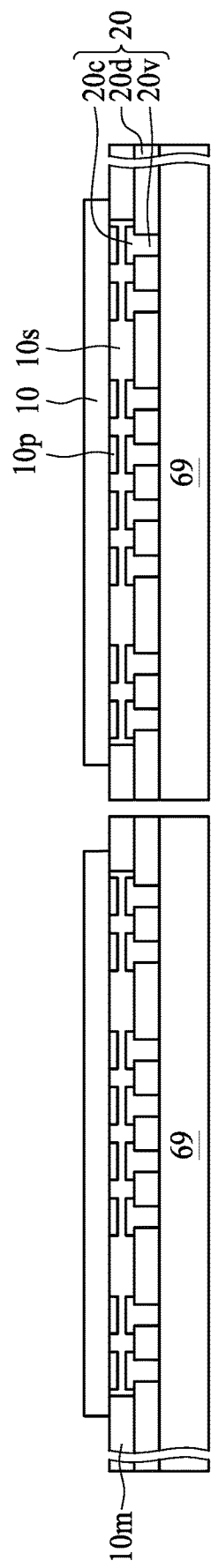

Referring to FIG. 6B, a plurality of carriers 10 (e.g., glass carriers) is disposed on the support elements 10m to define spaces 10s (e.g., air cavities). In some embodiments, the carriers 10 may be formed by performing a singulation operation to a wafer-type carrier (a panel-type carrier or a strip-type carrier) to divide the wafer-type carrier into a plurality carriers 10. Each of the carriers 10 has a conductive layer 10p on a surface of the carrier 10 facing the circuit layer 20. In some embodiments, the conductive layers 10p may be antenna patterns, light elements or sensors. The conductive layers 10p are substantially aligned with the conductive layers 20c. The conductive layers 10p and 20c are located within the space 10s. A singulation operation is then carried out through the support elements 10m and the circuit layer 20. The singulation may be performed, for example, by using a dicing saw, laser or other appropriate cutting technique. The carrier 69 is then removed.

Figure 6C:
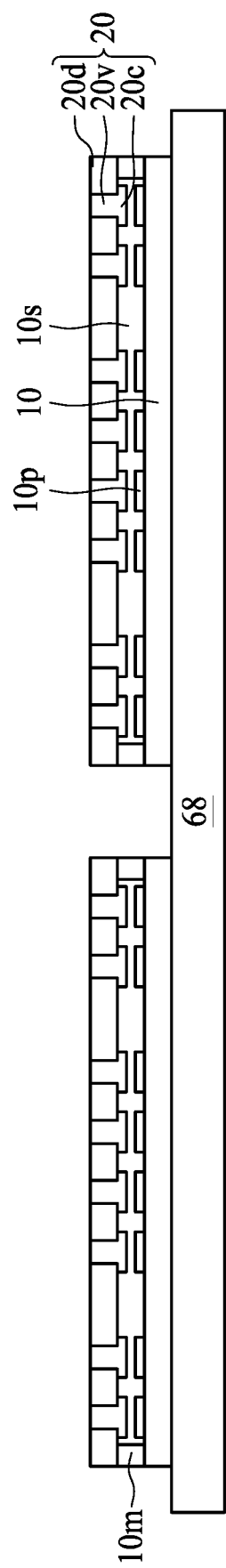

Referring to FIG. 6C, the carriers 10 are disposed on a release film 68. The carriers 10 are separated from each other. For example, there is a gap or distance between any two adjacent carriers. A recon process is then carried out.

Figure 6D:
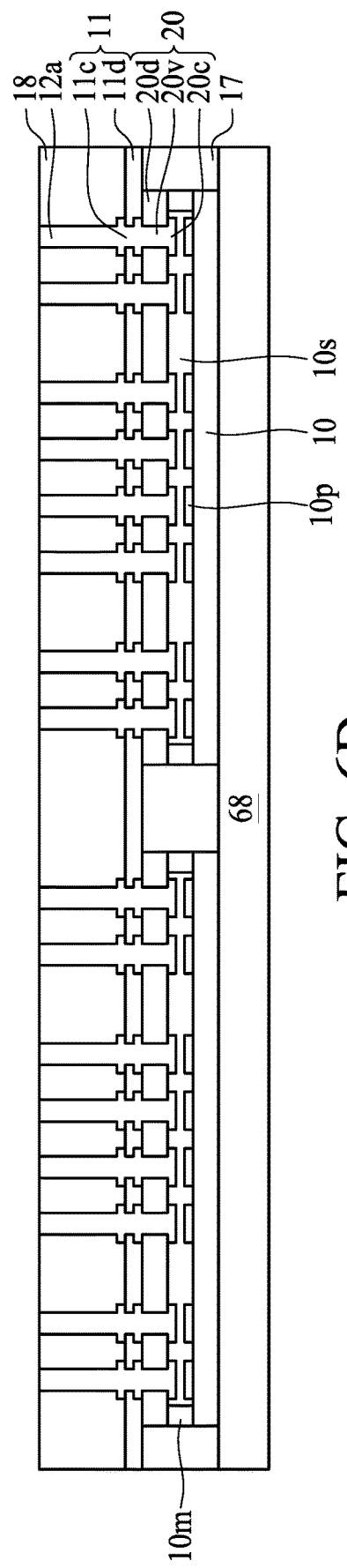

Referring to FIG. 6D, a package body 17 is form on the release film 69 to cover the carriers 10, the support elements 10m and the circuit layers 20. In some embodiments, the package body 17 is formed by, for example, by a transfer molding technique, a compression technique or any other suitable techniques. A circuit layer 11 including one or more conductive layers 11c and one or more dielectric layers 11d is formed on the circuit layer 20. The dielectric layer 11d is formed by, for example but is not limited to, photolithographic technique. Interconnection structures 12a are formed on the circuit layer 11 to be electrically connected to the circuit layer 11. In some embodiments, the interconnection structures 12a may be formed by, for example but is not limited to, plating technique. In some embodiments, the circuit layer 11 may be formed by fan-out process, bumping process or other suitable lithographic processes.

A package body 18 is then form on the circuit layer 11 to cover the interconnection layers 12a. In some embodiments, the package body 18 may be formed to fully cover the interconnection structures 12a. A portion of the package body 18 is removed by, for example, grinding or any other suitable techniques to expose a top portion of the interconnection structures 12a for electrical connections. In some embodiments, the package body 18 is formed by, for example, by a transfer molding technique, a compression technique or any other suitable techniques.

Figure 6E:
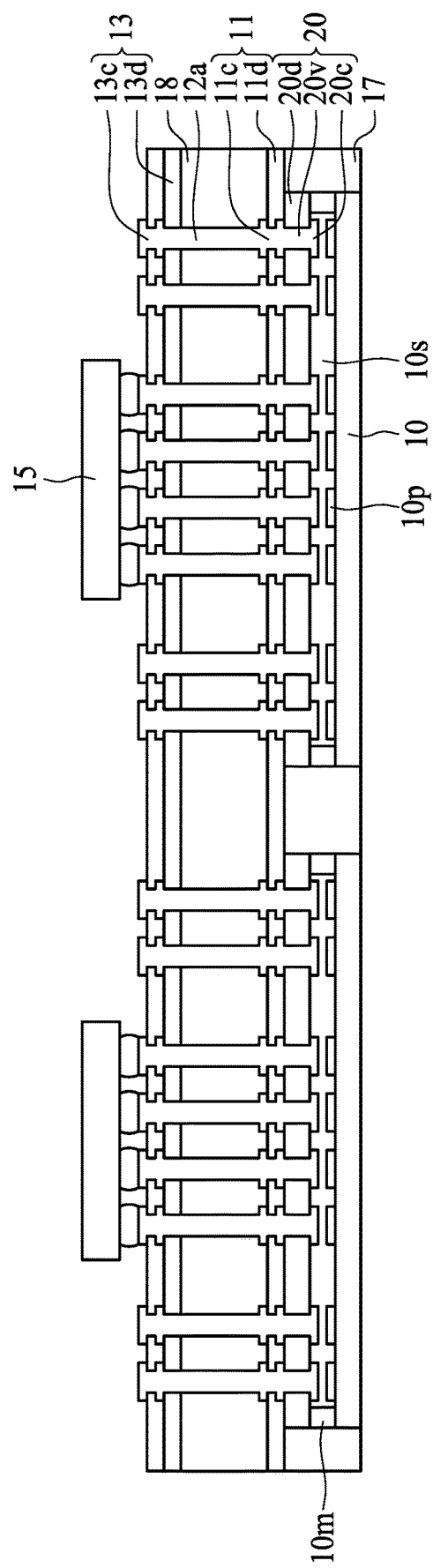

Referring to FIG. 6E, a circuit layer 13 including one or more conductive layers 13c and one or more dielectric layers 13d is formed on the package body 18 and electrically connected to the interconnection structures 12a exposed from the package body 18. An electronic component 15 is then disposed on the circuit layer 13 and electrically connected to the circuit layer 13. In some embodiments, the electronic component 15 may be connected to the circuit layer 13 through flip-chip or any other suitable processes. In some embodiments, the circuit layer 13 may be formed by fan-out process, bumping process or other suitable lithographic processes.

Figure 6F:
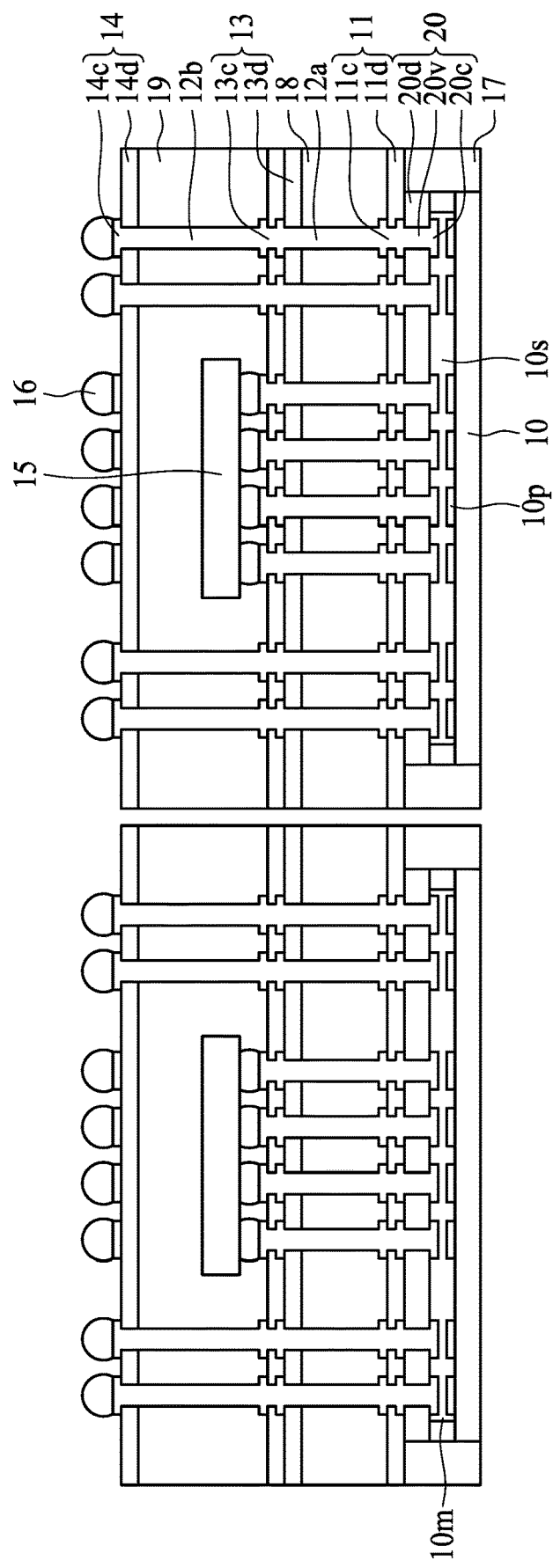

Referring to FIG. 6F, interconnection structures 12b are formed on the circuit layer 13 to be electrically connected to the circuit layer 13. A package body 19 is formed on the circuit layer 13 to cover the interconnection structures 12b and the electronic component 15. In some embodiments, the package body 19 may be formed to fully cover the interconnection structures 12b and the electronic component 15. A portion of the package body 19 is removed by, for example, grinding or any other suitable techniques to expose a top portion of the interconnection structures 12b for electrical connections. In some embodiments, the package body 19 is formed by, for example, by a transfer molding technique, a compression technique or any other suitable techniques.

A circuit layer 14 including one or more conductive layers 14c and one or more dielectric layers 14d is formed on the package body 19 and electrically connected to the interconnection structures 12b exposed from the package body 19. In some embodiments, the circuit layer 14 may be formed by fan-out process, bumping process or other suitable lithographic processes.

Electrical contacts 16 are then disposed on the conductive layer 14c exposed from the dielectric layer 14d. Singulation may be performed to separate out individual semiconductor package devices including the semiconductor package device 1A as shown in FIG. 1A. That is, the singulation is performed through the circuit layers 11, 13, 14 and the package bodies 17, 18 and 19. The singulation may be performed, for example, by using a dicing saw, laser or other appropriate cutting technique.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 µm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   an emitting device defining a cavity in the emitting device, the emitting device comprising:
   a first emitting layer;
   a support element disposed on the first emitting layer; and
   a second emitting layer disposed on the support element; and
   a first building-up circuit disposed on the emitting device, wherein a width of the emitting device is less than a width of the first building-up circuit.

2. The semiconductor device package of claim 1, wherein a lateral surface of the emitting device is recessed from a lateral surface of the first building-up circuit.

3. The semiconductor device package of claim 1, wherein a lateral surface of the emitting device is substantially coplanar with a lateral surface of the first building-up circuit.

4. The semiconductor device package of claim 1, further comprising a first package body covering a lateral surface of the emitting device and exposing surface of the emitting device adjacent to the lateral surface of the emitting device.

5. The semiconductor device package of claim 1, wherein
the first emitting layer including a first emitting pattern;
the second emitting layer including a dielectric layer, a via penetrating the dielectric layer and a second emitting pattern connected to the via; and
the second emitting pattern faces the first emitting pattern and substantially aligned with the first emitting pattern.

6. The semiconductor device package of claim 5, further comprising a first package body covering a lateral surface of the support element, a lateral surface of the first emitting layer and a lateral surface of the second emitting layer.

7. The semiconductor device package of claim 6, wherein the first package body and the dielectric layer of the second emitting layer include the same material.

8. The semiconductor device package of claim 5, wherein the support element directly contacts the dielectric layer of the second emitting layer.

9. The semiconductor device package of claim 1, wherein the support element fully surrounds the cavity.

10. The semiconductor device package of claim 1, further comprising:
a first set of conductive pillars disposed on the first building-up circuit; and
a second package body disposed on the first building-up circuit and covering the first set of conductive pillars.

11. The semiconductor device package of claim 10, further comprising:
a third building-up circuit disposed on the second package body;
a second set of conductive pillars disposed on the third building-up circuit; and
a third package body disposed on the third building-up circuit and covering the second set of conductive pillars.

12. The semiconductor device package of claim 11, further comprising an electronic component disposed on the third building-up circuit and covered by the third package body, the electronic component having an active surface facing the third building-up circuit and electrically connected to the third building-up circuit.

13. A semiconductor device package, comprising:
an antenna device defining a cavity in the antenna device, the antenna device comprising:
a first emitting layer;
a support element disposed on the first emitting layer; and
a second emitting layer disposed on the support element; and
an encapsulant covering a lateral surface of the antenna device and exposing a surface of the antenna device adjacent to the lateral surface of the antenna device.

14. The semiconductor device package of claim 13, wherein
the first emitting layer including a first emitting pattern;
the second emitting layer including a dielectric layer, a via penetrating the dielectric layer and a second emitting pattern connected to the via; and
the second emitting pattern faces the first emitting pattern and substantially aligned with the first emitting pattern.

15. The semiconductor device package of claim 13, wherein the support element fully surrounds the cavity.

\* \* \* \* \*